United States Patent
Hwang et al.

(10) Patent No.: US 7,598,481 B2
(45) Date of Patent: Oct. 6, 2009

(54) CMOS IMAGE SENSOR AND METHOD OF DRIVING THE SAME

(75) Inventors: Sung-In Hwang, Yongin-si (KR); Yong-Jei Lee, Seongnam-si (KR); Jung-Chak Ahn, Suwon-si (KR); Ju-Hyun Ko, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 144 days.

(21) Appl. No.: 11/679,319

(22) Filed: Feb. 27, 2007

(65) Prior Publication Data

US 2008/0035966 A1 Feb. 14, 2008

(30) Foreign Application Priority Data

Feb. 27, 2006 (KR) ............... 10-2006-0018885

(51) Int. Cl.
*G01J 1/44* (2006.01)
*H01L 27/00* (2006.01)

(52) U.S. Cl. .............. 250/214 R; 250/208.1; 348/297; 348/302; 348/308

(58) Field of Classification Search ............ 250/208.1, 250/208.2, 214 R, 214.1, 214 DC, 214 C; 348/294, 297, 298, 302–304, 308; 257/431, 257/443, 444, 445

See application file for complete search history.

(56) References Cited

U.S. PATENT DOCUMENTS

2007/0091191 A1* 4/2007 Oike ..................... 348/294

FOREIGN PATENT DOCUMENTS

JP 11-298798 10/1999
WO 2004/019605 A1 3/2004

* cited by examiner

*Primary Examiner*—Thanh X Luu
*Assistant Examiner*—Francis M Legasse, Jr.
(74) *Attorney, Agent, or Firm*—F. Chau & Assoc., LLC

(57) ABSTRACT

A complementary metal-oxide semiconductor (CMOS) image sensor and a method of driving the CMOS image sensor that can reduce the number of devices required by each of a plurality of pixels and can stably drive the pixels, in which each of the pixels includes a photodiode that converts light energy into an electrical signal, a transfer transistor that transmits photocarriers stored in the photodiode to a floating diffusing region, a drive transistor that has a gate connected to the floating diffusion region and drives a voltage signal according to a voltage of the floating diffusion region, the voltage signal being output to an external device, and a capacitive device that is connected between a control voltage source and the floating diffusion region and, when a sensing operation of a corresponding pixel is terminated, deselects the pixel by altering the voltage of the floating diffusion region according to a control voltage provided by the control voltage source.

20 Claims, 5 Drawing Sheets

CMOS IMAGE SENSOR AND METHOD OF DRIVING THE SAME

CROSS-REFERENCE TO RELATED PATENT APPLICATION

The application claims the benefit of Korean Patent Application No. 10-2006-0018885, filed on Feb. 27, 2006, in the Korean Intellectual Property Office, the disclosure of which is incorporated herein in its entirety by reference.

BACKGROUND OF THE INVENTION

1. Technical Field

The present disclosure relates to a complementary metal-oxide semiconductor (CMOS) image sensor and a method of driving the same, and more particularly, to a CMOS image sensor and a method of driving the same that can reduce the number of devices required by each of a plurality of pixels and can stably drive the pixels.

2. Discussion of Related Art

In general, image sensors are classified into charge coupled device (CCD) image sensors or complementary metal-oxide semiconductor (CMOS) image sensors. CCD image sensors comprise a photocarrier accumulation unit that photographs an external object, absorbs light, and accumulates photocarriers, a transmission unit that transmits the accumulated photocarriers, and an output unit that outputs the photocarriers transmitted by the transmission unit as electrical signals.

Photodiodes are generally used as photocarrier accumulation units in the CCD image sensors. Photocarriers accumulated in a photodiode are transmitted externally by a transmission unit and an output unit of the CCD image sensor. Once the detection of an electrical signal by the CCD image sensor is terminated, the photocarriers accumulated in the photodiode must be discharged to make way for a subsequent image sensing operation. This operation is referred to as a reset operation.

It is more complicated to drive CCD image sensors, which operate as described above, than to drive CMOS image sensors, and CCD image sensors consumer more power than CMOS image sensors. Therefore, CMOS image sensors, which consume less power and offer a higher integration density than CCD image sensors, are more widely used.

FIG. 1A is a circuit diagram of a pixel 10 of a typical CMOS image sensor. Referring to FIG. 1A, the pixel 10 includes a photodiode PD that generates photocarriers by receiving light, and a plurality of transistors, including a transfer transistor T1, a resent transistor T2, a drive transistor T3, and a select transistor T4.

The transfer transistor T1 transmits photocarriers accumulated in the photodiode PD to a floating diffusion region FD in response to a transmission control signal Tx. The reset transistor T2 resets the electric potential of the floating diffusion region FD to a power supply voltage VDD in response to a reset signal Rx, thereby discharging photocarriers stored in the floating diffusion region FD.

The drive transistor T3 serves as a source follower-buffer amplifier. The select transistor T4 performs an addressing operation. More specifically, the select transistor T4 is turned on in response to a selection control signal Sx and, thus, transmits an output signal of the pixel 10 to an external device via an output port OUT. A load transistor T5 may be connected to the pixel 10. The load transistor T5 can read the voltage of the output signal of the pixel 10 under control of a predetermined load control signal LOAD.

The operation of the pixel 10 will now be described in detail with reference to FIG. 1B.

Referring to FIG. 1B, the selection control signal Sx is activated and input to selected ones of a plurality of pixels from which data is to be read, including the pixel 10. Then, the select transistor T4 is turned on, and the pixel 10 is chosen.

During the activation of the reset signal Rx, the reset transistor T2 is turned on, and the floating diffusion region FD is reset. Then the reset signal Rx is inactivated, and the voltage of a signal output from the output port OUT is detected at a time a.

Thereafter, when the transmission control signal Tx is activated, photocarriers accumulated in the photodiode PD are transmitted to the floating diffusion region FD. Then, the voltage of the floating diffusion region FD decreases. During the activation of the transmission control signal Tx, sufficient photocarriers are transmitted to the floating diffusion region FD. Thereafter, the transmission control signal Tx is inactivated, and the voltage of the signal output from the output port OUT is detected at a time b. The difference between the voltage detected at the time a and the voltage detected at the time b is calculated, and analog data obtained using the calculation is converted into digital data. In this manner, it is possible to obtain information regarding the amount of light sensed by the pixel 10.

FIG. 2A is a circuit diagram of a pixel 20 of a conventional CMOS image sensor having a tri-transistor structure. The number of transistors required by each pixel of the CMOS image sensor illustrated in FIG. 2A is much smaller than the number of transistors required by each pixel of the CMOS image sensor illustrated in FIG. 1A.

FIG. 2B is a diagram illustrating waveforms of control signals used to drive the pixel 20 of the CMOS image sensor illustrated in FIG. 2A. The operation of the CMOS image sensor illustrated in FIG. 2A will now be described in detail with reference to FIGS. 2A and 2B.

Referring to FIG. 2A, the pixel 20, which has a tri-transistor structure, includes a photodiode PD that generates photocarriers, and a plurality of transistors, including a transfer transistor T5, a reset transistor T6, and a drive transistor T7.

The transfer transistor T5 transmits photocarriers accumulated in the photodiode PD to a floating diffusion region FD in response to a transmission control signal TRF. The reset transistor T6 resets the electric potential of the floating diffusion region FD to a power supply voltage VDD in response to a reset signal RST. The drive transistor T7 serves as a source follower-buffer amplifier. The pixel 20, unlike the pixel 10 illustrated in FIG. 1A, does not require a select transistor.

Referring to FIG. 2B, a voltage signal DRN having a logic high level is input to an electrode of the drive transistor T7. When the reset signal RST is activated, the reset transistor T6 is turned on and resets the electric potential of the floating diffusion region FD to the level of the voltage signal DRN. Thereafter, the reset signal Rx is inactivated, and the voltage of a signal output from the output port OUT is detected a time a.

When the transmission control signal TRF is activated, the photocarriers accumulated in the photodiode PD are transmitted to the floating diffusion region FD. Thereafter, when the transmission control signal TRF is inactivated, the voltage of the signal output from the output port OUT is detected at a time b.

When a sensing operation of the pixel 20 is terminated, it is necessary to deselect the pixel 20. To accomplish this, the voltage signal DRN becomes logic low, and the reset signal RST is activated for a predetermined time period. Then, the voltage of the floating diffusion region FD decreases, and the drive transistor T7, whose gate is connected to the floating diffusion region FD, is turned off, thereby deselecting the pixel 20.

In the case of a conventional CMOS image sensor comprised of a plurality of pixels having a tri-transistor structure, it is necessary to alter the level of a voltage signal applied to an electrode of a drive transistor T7. Noise, however, may be generated while a switching operation is performed to change the level of the voltage signal. Once noise is generated in the voltage signal input to the drive transistor T7, unstable data is likely to be output due to variations in the gain of the drive transistor T7.

SUMMARY OF THE INVENTION

Exemplary embodiments of the present invention provide a complementary metal-oxide semiconductor (CMOS) image sensor and a method of driving the same that can reduce the number of devices required by each of a plurality of pixels and can stably drive the plurality of the pixels.

According to an exemplary embodiment of the present invention, there is provided a complementary metal-oxide semiconductor (CMOS) image sensor comprising a plurality of pixels having a tri-transistor structure. Each of the pixels includes a photodiode that converts light energy into an electrical signal, a transfer transistor that transmits photocarriers stored in the photodiode to a floating diffusion region, a drive transistor that has a gate connected to the floating diffusion region and that drives a voltage signal according to a voltage of the floating diffusion region, the voltage signal being output to an external device, and a capacitive device that is connected between a control voltage source and the floating diffusion region and, when a sensing operation of a corresponding pixel is terminated, deselects the pixel by altering the voltage of the floating diffusion region according to a control voltage provided by the control voltage source.

The capacitive device may deselect the pixel by altering the voltage of the floating diffusion region of the pixel, so that the drive transistor can be turned off.

The capacitive device may include a capacitor that has a first electrode connected to the control voltage source and a second electrode connected to the floating diffusion region.

The capacitor may be connected in series to a capacitance component of the floating diffusion region, so that the floating diffusion region forms a common node therebetween.

The CMOS image sensor may also include a reset transistor that resets the floating diffusion region in response to a reset control signal, wherein the drive transistor and the reset transistor are connected to a power supply voltage source.

The capacitive device may include a capacitor having a polysilicon-insulator-polysilicon (PIP) structure, alternatively, the capacitive device may include a capacitor having a metal-insulator-metal (MIM) structure.

According to an exemplary of the present invention, there is provided a complementary metal-oxide semiconductor (CMOS) image sensor comprising a plurality of pixels having a tri-transistor structure. Each of the pixels includes a photodiode that converts light energy into an electrical signal, a transfer transistor that transmits photocarriers stored in the photodiode to a floating diffusion region, a drive transistor that has a gate connected to the floating diffusion region and drives a voltage signal according to a voltage of the floating diffusion region, the voltage signal output to an external device, and a capacitive device that is connected between a control voltage source and the floating diffusion region and alters the voltage of the floating diffusion region according to a control voltage provided by the control voltage source, wherein the control voltage is activated to a first level for a predetermined time period after a sensing operation of a corresponding pixel is terminated, and, when the control voltage is changed from the first level to a second level, the capacitive device deselects the corresponding pixel by altering the voltage of the floating diffusion region.

According to an exemplary of the present invention, there is provided a method of driving a CMOS image sensor comprising a plurality of pixels having a tri-transistor structure. The method includes detecting an output voltage signal after resetting a floating diffusion region of a pixel, transmitting photocarriers stored in a photodiode of the pixel to the floating diffusion region and detecting an output voltage signal, when a sensing operation of the pixel is terminated, activating a control voltage provided by a control voltage source to a first level for a capacitive device of the pixel for a predetermined time period, the capacitive device being connected between the control voltage source and the floating diffusion region, and deselecting the pixel by altering a voltage of the floating diffusion region when the control voltage is changed from the first level to a second level.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1A:
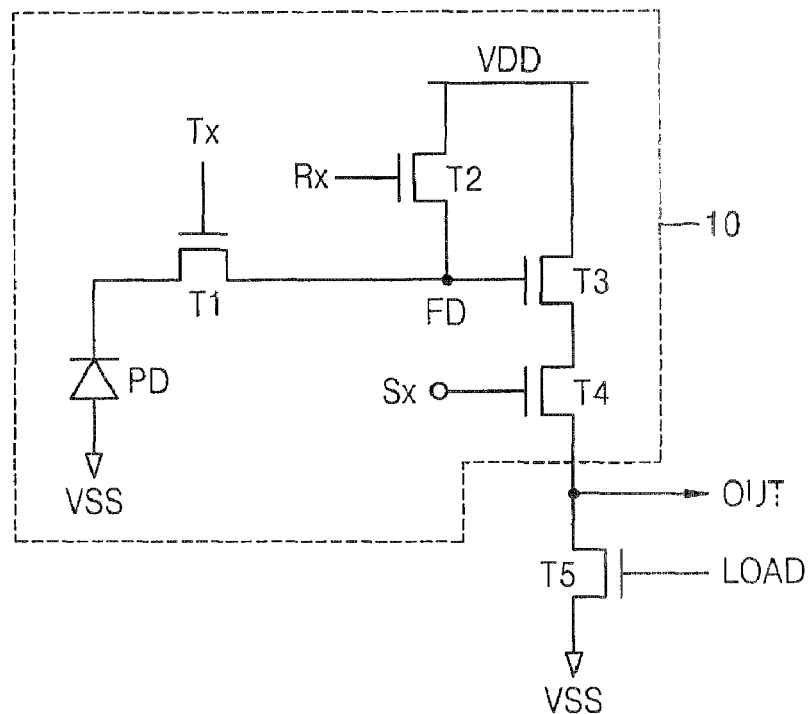
FIG. 1A is a circuit diagram of a pixel of a conventional complementary metal-oxide semiconductor (CMOS) image sensor.
Figure 1B:
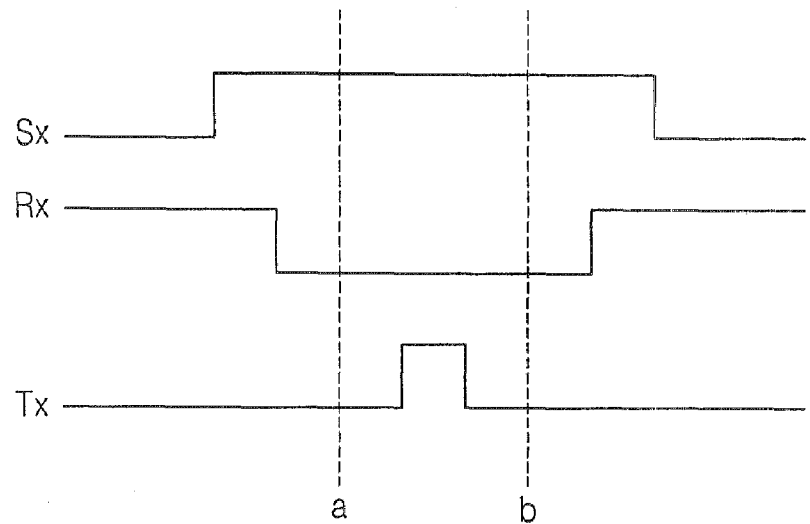
FIG. 1B is a timing diagram illustrating waveforms of control signals used to drive the pixel illustrated in FIG. 1A.
Figure 2A:
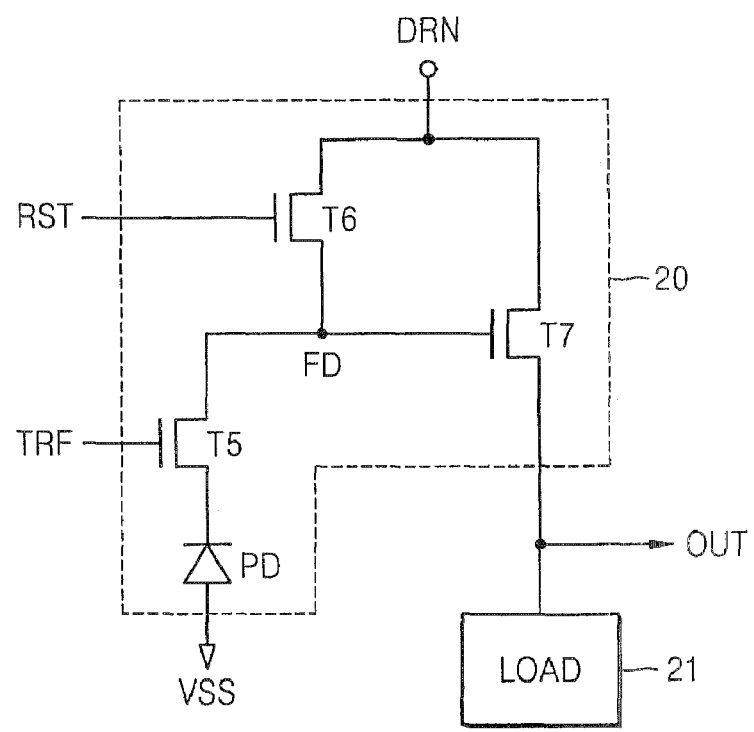
FIG. 2A is a circuit diagram of a pixel of a conventional CMOS image sensor having a tri-transistor structure.
Figure 2B:
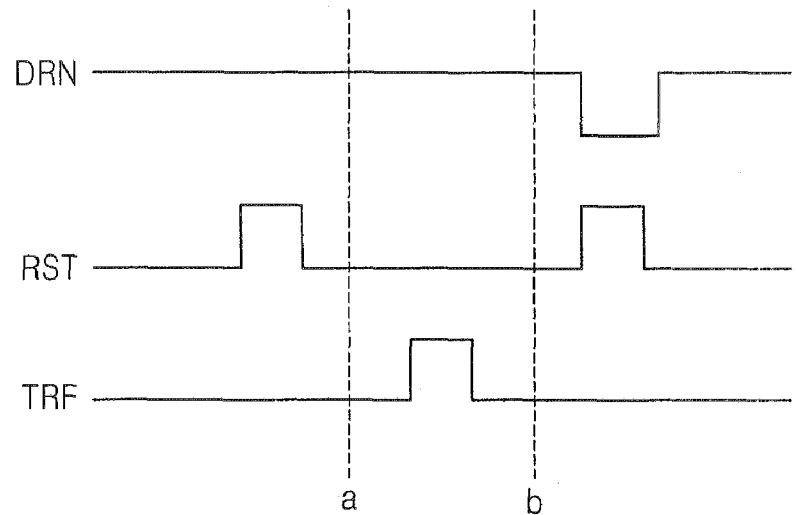
FIG. 2B is a timing diagram illustrating waveforms of control signals used to drive the pixel illustrated in FIG. 2B.

The present invention will now be described more fully with reference to the accompanying drawings in which exemplary embodiments of the invention are shown. In the drawings, like reference numerals represent like elements.

Figure 3:
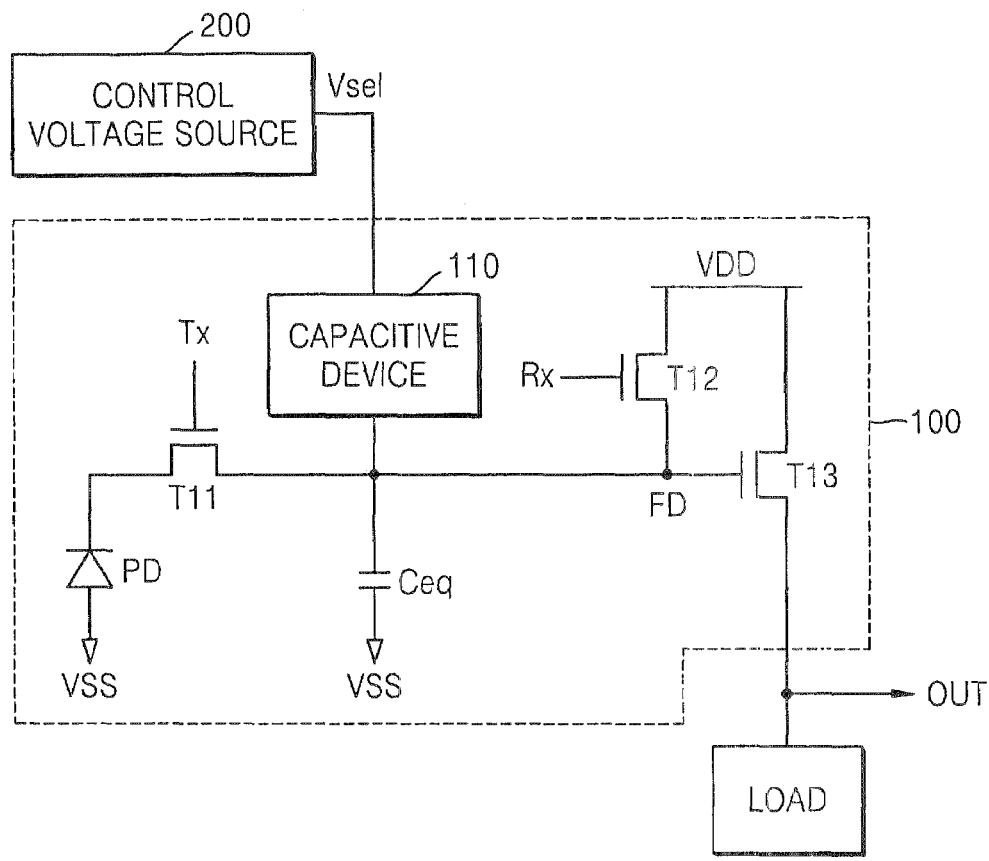
FIG. 3 is a circuit diagram of a pixel of a CMOS image sensor according to an exemplary embodiment of the present invention.

FIG. 3 is a circuit diagram of a pixel 100 of a complementary metal-oxide semiconductor (CMOS) image sensor according to an exemplary embodiment of the present invention. Referring to FIG. 3, the CMOS image sensor comprises a plurality of pixels having a tri-transistor structure like the one shown in FIG. 3. The pixel 100 includes a photodiode PD that generates photocarriers by receiving light, and a plurality of transistors, including a transfer transistor T11, a reset transistor T12, and a drive transistor T13.

An electrode of the transfer transistor T11 is connected to the photodiode PD, and another electrode of the transfer transistor T11 is connected to a floating diffusion region FD.

A transmission control signal Tx is input to the gate of the transfer transistor T11. The transfer transistor T11 transmits photocarriers accumulated in the photodiode PD to the floating diffusion region FD in response to the transmission control signal Tx.

An electrode of the reset transistor T12 is connected to a power supply voltage source that supplies a power supply voltage VDD, and another electrode of the reset transistor T12 is connected to the floating diffusion region FD. A reset signal Rx is input to the gate of the reset transistor T12. The reset transistor T12 resets the electric potential of the floating diffusion region FD to the power supply voltage VDD in response to the reset signal Rx.

An electrode of the drive transistor T13 is connected to the power supply voltage VDD, and another electrode of the drive transistor T13 is connected to an output port OUT and a load LOAD. The gate of the drive transistor T13 is connected to the floating diffusion region FD. The drive transistor T13 drives a voltage signal according to the voltage of the floating diffusion region FD, which is output from the pixel 100 via the output port OUT.

According to an exemplary embodiment of the present invention, the CMOS image sensor also includes a capacitive device 110. The capacitive device 110 may be connected between a control voltage source 200 and the floating diffusion region FD. The control voltage source 200 applies a control voltage Vsel to one electrode of the capacitive device 110. The control voltage Vsel is a signal whose level varies according to an operating state of the pixel 100.

Once a sensing operation of the pixel 100 is terminated, the control voltage Vsel changes. Then, the capacitive device 110, to which the control voltage Vsel is applied, alters the voltage of the floating diffusion region FD according to the control voltage Vsel. More specifically, when the sensing operation of the pixel 100 is terminated, the capacitive device 110 turns off the drive transistor T13 by reducing the voltage of the floating diffusion region FD and, thus, deselects the pixel 100.

Reference character Ceq indicates a capacitance component of the floating diffusion region FD. The capacitive device 110 may be connected in series to the capacitance component Ceq such that the floating diffusion region FD forms a common node therebetween.

Figure 4:
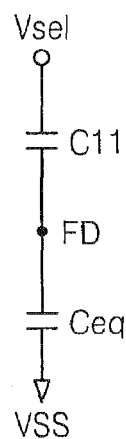
FIG. 4 is a circuit diagram of a capacitive device used in the pixel illustrated in FIG. 3.

FIG. 4 is a circuit diagram of the capacitive device 110 illustrated in FIG. 3 according to an exemplary embodiment of the present invention. Referring to FIG. 4, the capacitive device 110 may be comprised of a capacitor C11. A first electrode of the capacitor C11 may be connected to the control voltage source 200 that generates the control voltage Vsel, and a second electrode of the capacitor C11 may be connected to the floating diffusion region FD. The capacitor C11 may have a polysilicon-insulator-polysilicon (PIP) structure or a metal-insulator-metal (MIM) structure.

The operation of the CMOS image sensor illustrated in FIG. 3 will now be described in detail with reference to FIG. 5.

Figure 5:
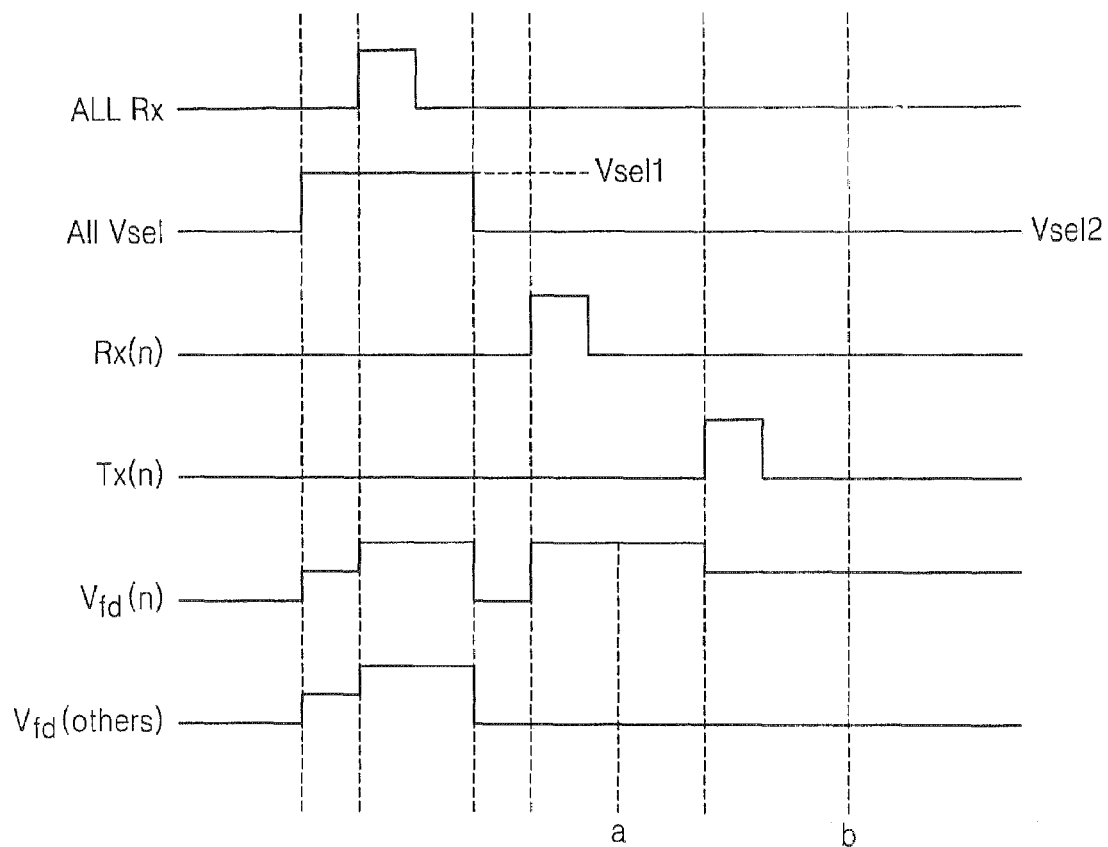
FIG. 5 is a timing diagram illustrating the waveforms of control signals and control voltages used to drive the pixel illustrated in FIG. 3.

FIG. 5 is a timing diagram illustrating waveforms of control signals and control voltages used to drive the pixel 100 illustrated in FIG. 3. It is assumed that a reset signal Rx(n) and a transmission control signal Tx(n) are applied to the pixel 100, and that the floating diffusion region FD of the pixel 100 has a voltage Vfd(n).

Referring to FIG. 5, a control voltage ALL Vsel, which is input to a plurality of capacitive devices of respective corresponding pixels, including the pixel 100 shown in FIG. 3, increases to a first level Vsel1. The capacitive devices alter a voltage Vfd(others) of the other floating diffusion regions FD of the pixels according to the control voltage Vsel. When the control voltage ALL Vsel increases, the voltage Vfd(n) of the floating diffusion region FD of the pixel 100 and the voltage Vfd(others) of the floating diffusion regions FD of the pixels other than the pixel 100 also increase.

Thereafter, a reset signal ALL Rx, which is input to the pixels, is activated for a predetermined time period. Then, the floating diffusion regions FD of the pixels are reset to a power supply voltage VDD. Accordingly, the voltages Vfd(n) and Vfd(others) increase.

Thereafter, the control voltage ALL Vsel decreases to a second level Vsel2. Then, the voltages Vfd(n) and Vfd(others) also decrease. In addition, a plurality of drive transistors respectively connected to the floating diffusion regions FD of the pixels are turned off, thereby deselecting the pixels.

In order to obtain information regarding the amount of light sensed by one of the pixels, for example, the pixel 100 shown in FIG. 3, the reset signal Rx(n) is activated for a predetermined time period. Then, the floating diffusion region FD of the pixel 100 is reset so that the voltage Vfd(n) increases to the power supply voltage VDD, whereas the voltage Vfd(others) is maintained at a low level.

Thereafter, the voltage of a signal output from the output port OUT is detected at a time a after the floating diffusion region FD of the pixel 100 is reset.

Then, when the transmission control signal Tx(n) is activated for a predetermined time period, the photocarriers accumulated in the photodiode PD of the pixel 100 are transmitted to the floating diffusion region FD of the pixel 100. Accordingly, the voltage Vfd(n) decreases. Thereafter, the voltage of a signal output from the output port OUT is detected at a time b.

Once the aforementioned sensing operation of the pixel 100 is terminated, it is necessary to deselect the pixel 100. For this, operations corresponding to the waveforms illustrated in FIG. 5 must be performed again. More specifically, the control voltage ALL Vsel is activated to the first level Vsel for a predetermined time period. The reset signal ALL Rx is maintained to be activated for a predetermined time period during the activation of the control voltage ALL Vsel to the first level Vsel. Thereafter, the control voltage ALL Vsel is changed from the first level Vsel1 to the second level Vsel2. Then the voltages Vfd(n) and Vfd(others) decrease. Accordingly, the drive transistors of all the pixels, including the pixel 100, are turned off, and the pixels are deselected.

The CMOS image sensor according to an exemplary embodiment of the present invention has been described above with reference to FIG. 5 as being driven in such a manner that one of a plurality of pixels of the CMOS image sensor is chosen, information regarding the amount of light received by the chosen pixel is transmitted to an external device, and the chosen pixel is deselected by turning off the drive transistors of the pixels. Exemplary embodiments of the present invention, however, are not restricted to that operation. For example, the chosen pixel can be deselected by adjusting a control voltage Vsel and a reset signal Rx that are only input to the chosen pixel to reduce the voltage of a floating diffusion region FD of the chosen pixel.

Figure 6:
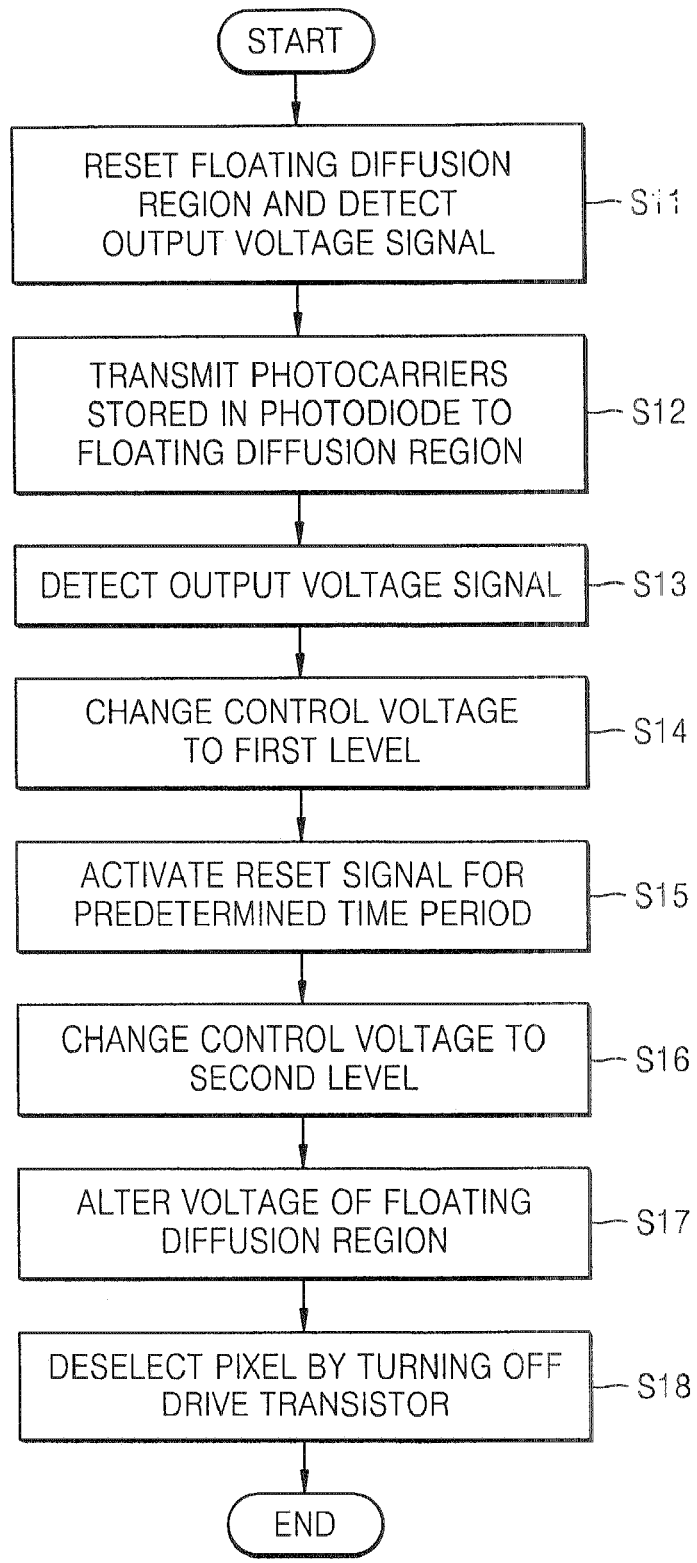
FIG. 6 is a flowchart illustrating a method of driving a CMOS image sensor according to an exemplary embodiment of the present invention.

FIG. 6 is a flowchart illustrating a method of driving a CMOS image sensor according to an exemplary embodiment of the present invention and, in this example, the CMOS image sensor comprises a plurality of pixels having a tri-transistor structure. In operation S11, a floating diffusion region, FD of FIG. 3, of a pixel of the CMOS image sensor is reset, and an output voltage signal is detected.

In operation S12, when a transfer transistor of the pixel is turned on, photocarriers stored in a photodiode of the pixel are transmitted to the floating diffusion region. In operation S13, an output voltage signal is detected.

In operation S14, when the aforementioned sensing operation of the pixel is terminated, a capacitive device of the pixel, which is connected between a control voltage source and the floating diffusion region, alters a control voltage from a second level (that is, a low level) to a first level (that is, a high level). In operation S15, after the control voltage is changed to the first level, a reset signal is activated for a predetermined time period, thereby resetting the floating diffusion region.

In operation S16, the control voltage is changed from the first level to the second level. In operation S17, the capacitive device alters the voltage of the floating diffusion region. Accordingly, a device transistor whose gate is connected to the floating diffusion region is turned on. Then, in operation S18, the pixel is deselected.

According to an exemplary embodiment of the present invention, it is possible to reduce the number of devices required by each of the plurality of pixels of a CMOS image sensor and to stably drive the pixels by applying a uniform voltage to the electrodes of a plurality of drive transistors of the respective pixels.

While the present invention has been particularly shown and described with reference to exemplary embodiments thereof, it will be understood by those of ordinary skill in the art various changes in form and details may be made therein without departing from the spirit and scope of the present invention, as defined by the following claims.

What is claimed is:

1. A complementary metal-oxide semiconductor (CMOS) image sensor including a plurality of pixels each having a tri-transistor structure, each pixel comprising:
   a photodiode that converts light energy into an electrical signal;
   a transfer transistor that transmits photocarriers stored in the photodiode to a floating diffusion region;
   a drive transistor that has a gate connected to the floating diffusion region and that drives a voltage signal according to a voltage of the floating diffusion region, the voltage signal being output to an external device; and
   a capacitive device that is connected between a control voltage source and the floating diffusion region and, when a sensing operation of a corresponding pixel is terminated, that deselects the pixel by altering the voltage of the floating diffusion region according to a control voltage provided by the control voltage source.

2. The CMOS image sensor of claim 1, wherein the capacitive device deselects the pixel by altering the voltage of the floating diffusion region of the pixel, so that the drive transistor is turned off.

3. The CMOS image sensor of claim 1, wherein the capacitive device comprises a capacitor that has a first electrode connected to the control voltage source and a second electrode connected to the floating diffusion region.

4. The CMOS image sensor of claim 3, wherein the capacitor is connected in series to a capacitance component of the floating diffusion region, so that the floating diffusion region forms a common node therebetween.

5. The CMOS image sensor of claim 1 further comprising a reset transistor that resets the floating diffusion region in response to a reset control signal,
   wherein the drive transistor and the reset transistor are connected to a power supply voltage source.

6. The CMOS image sensor of claim 1, wherein the capacitive device comprises a capacitor having a polysilicon-insulator-polysilicon (PIP) structure.

7. The CMOS image sensor of claim 1, wherein the capacitive device comprises a capacitor having a metal-insulator-metal (MIM) structure.

8. A complementary metal-oxide semiconductor (CMOS) image sensor including a plurality of pixels each having a tri-transistor structure, each pixel comprising:
   a photodiode that converts light energy into an electrical signal;
   a transfer transistor that transmits photocarriers stored in the photodiode to a floating diffusion region;
   a drive transistor that has a gate connected to the floating diffusion region and that drives a voltage signal according to a voltage of the floating diffusion region, the voltage signal being output to an external device; and
   a capacitive device that is connected between a control voltage source and the floating diffusion region and that alters the voltage of the floating diffusion region according to a control voltage provided by the control voltage source;
   wherein the control voltage is activated to a first level for a predetermined time period after a sensing operation of a corresponding pixel is terminated and, when the control voltage is changed from the first level to a second level, the capacitive device deselects the corresponding pixel by altering the voltage of the floating diffusion region.

9. The CMOS image sensor of claim 8, wherein the first level is a high level, and the second level is lower than the first level.

10. The CMOS image sensor of claim 9, wherein the capacitive device deselects the pixel by altering the voltage of the floating diffusion region of the pixel to a level that turns off the drive transistor of the corresponding pixel.

11. The CMOS image sensor of claim 10, wherein the degree to which the voltage of the floating diffusion region is altered is determined by a capacitance of the capacitive device.

12. The CMOS image sensor of claim 8 further comprising a reset transistor that resets the floating diffusion region in response to a reset control signal,
   wherein the reset signal is activated during the activation of the control voltage to the first level.

13. The CMOS image sensor of claim 8, wherein the capacitive device comprises a capacitor that has a first electrode connected to the control voltage source and a second electrode connected to the floating diffusion region.

14. The CMOS image sensor of claim 13, wherein the capacitor is connected in series to a capacitance element of the floating diffusion region, so that the floating diffusion region forms a common node therebetween.

15. The CMOS image sensor of claim 8, wherein the capacitive device comprises a capacitor having a PIP structure.

16. The CMOS image sensor of claim 8, wherein the capacitive device comprises a capacitor having an MIM structure.

17. A method of driving a CMOS image sensor including a plurality of pixels each having a tri-transistor structure, the method comprising:
   detecting an output voltage signal after resetting a floating diffusion region of a pixel;
   transmitting photocarriers stored in a photodiode of the pixel to the floating diffusion region and detecting an output voltage signal;
   when a sensing operation of the pixel is terminated, activating a control voltage provided by a control voltage sensor to a first level for a capacitive device of the pixel for a predetermined time period, the capacitive device being connected between the control voltage source and the floating diffusion region; and deselecting the pixel by altering a voltage of the floating diffusion region when the control voltage is changed from the first level to a second level.

18. The method of claim 17, wherein the first level is a high level, and the second level is lower than the first level.

19. The method of claim 18, wherein the step of deselecting comprises deselecting the pixel by altering the voltage of the floating diffusion region to such a level that a drive transistor of the pixel can be turned off.

20. The method of claim 17 further comprising activating a reset signal to turn on a reset transistor of the pixel during the activation of the control voltage to the first level.

* * * * *